(12) United States Patent
Kurusu et al.

(10) Patent No.: US 8,610,282 B2
(45) Date of Patent: Dec. 17, 2013

(54) SEMICONDUCTOR DEVICE AND METHOD OF MANUFACTURING THE SAME

(75) Inventors: Takashi Kurusu, Yokohama (JP);
Takashi Izumida, Yokohama (JP);
Hiroyoshi Tanimoto, Yokohama (JP);
Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 13/109,086

(22) Filed: May 17, 2011

(65) Prior Publication Data
US 2011/0284996 A1     Nov. 24, 2011

(30) Foreign Application Priority Data

May 24, 2010   (JP) ................................. 2010-118386

(51) Int. Cl.
*H01L 23/13*     (2006.01)
(52) U.S. Cl.
USPC ..................... 257/773; 257/635; 257/E23.002
(58) Field of Classification Search
USPC .................. 257/316–324, E23.142, E23.143, 257/E23.001, E23.141, E23.154, E21.575, 257/635, 773, E23.002, E21.495, E23.144, 257/E23.145, E23.146, E23.151, E23.171, 257/E23.175
See application file for complete search history.

(56) References Cited

U.S. PATENT DOCUMENTS

| | | | |
|---|---|---|---|
| 2007/0238204 A1* | 10/2007 | Kurihara et al. | 438/14 |
| 2008/0001176 A1* | 1/2008 | Gopalakrishnan et al. | 257/211 |
| 2009/0017627 A1* | 1/2009 | Greeley et al. | 438/697 |
| 2010/0164074 A1* | 7/2010 | King | 257/635 |

OTHER PUBLICATIONS

Bunday, Benjamin D., et al. "Determination of optimal parameters for CD-SEM measurement of line-edge roughness." Proceedings of SPIE. vol. 5375. 2004.*
Asenov, A., et al., "Intrinsic Prarameter Fluctuations in Decananometer MOSFETs Introduced by Gate Edge Roughness", IEEE Trans. Electron Devices, vol. 50, No. 5, pp. 2003, 1254-1260.
Kurusu, T., et al., "Compact and Efficient Monte Carlo Method to Reproduce Size on Resistivity in Sub-0.1 Metallic Interconnects", Proc. of 2009 International Conference on Simulation of Semiconductor Processes and Devices, 2009, pp. 170-173.
Traving, M., et al., "Damascene and subtractive processing of narrow tungsten lines: Resistivity and size effect", J. Appl. Phys., vol. 100, 094325, 2006.
Noguchi, et al., "Simple Self-Aligned Air-Gap Interconnect Process with Cu/FSG Structure", Proc. 2003, International Interconnect Technology Conference, pp. 68-70.
Steinlesberger, G., et. al., "Aluminium Nano Interconnects", Proc. 2004, International Inter-Connect Technology Conference, pp. 51-53.
Lopez, G., et al., "A New Physical Model and Experimental Measurements of Copper Interconnect Resistivity Considering Size Effects and Line-Edge Roughness (LER)", IEEE, 2009, pp. 231-233.

* cited by examiner

*Primary Examiner* — Cuong Q Nguyen
*Assistant Examiner* — Yosef Gebreyesus
(74) *Attorney, Agent, or Firm* — White & Case LLP

(57) ABSTRACT

In one embodiment, a semiconductor device includes a substrate, and a plurality of interconnects provided in the same interconnect layer above the substrate. The device further includes a plurality of insulators provided so as to be buried between the plurality of interconnects. Moreover, the plurality of interconnects include an interconnect group in which $2^N$ or more interconnects are successively arrayed so that correlation coefficients of line edge roughness (LER) between both side surfaces of the respective interconnects are positive, where N is an integer of 4 or more.

9 Claims, 11 Drawing Sheets

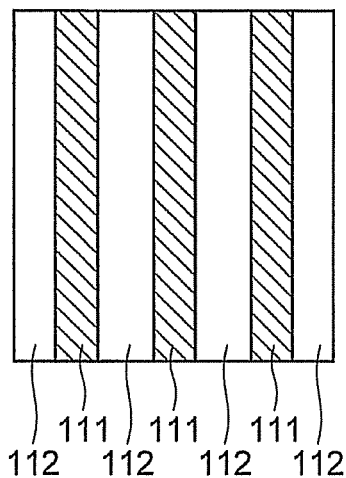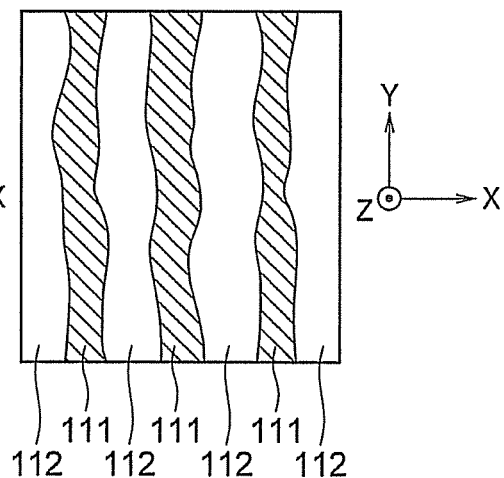
FIG.2A　　　　　　　　　FIG.2B
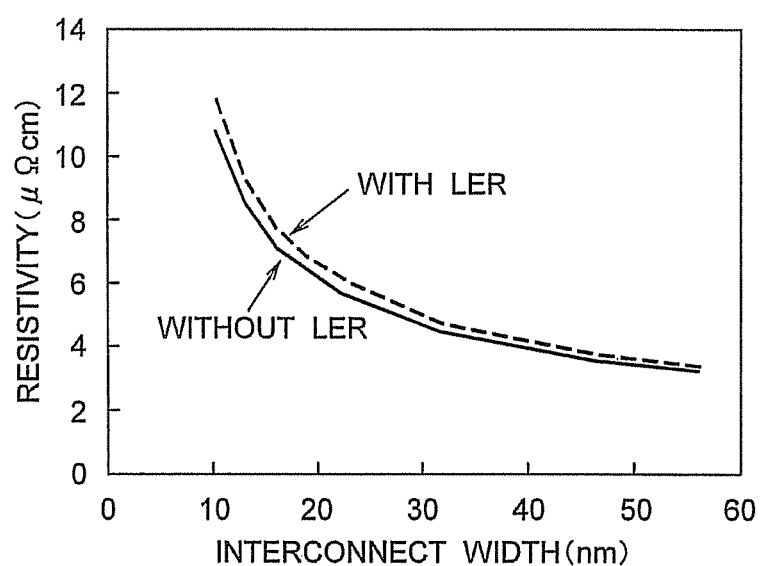
FIG.3

σ = −1

σ = 0

σ = +1

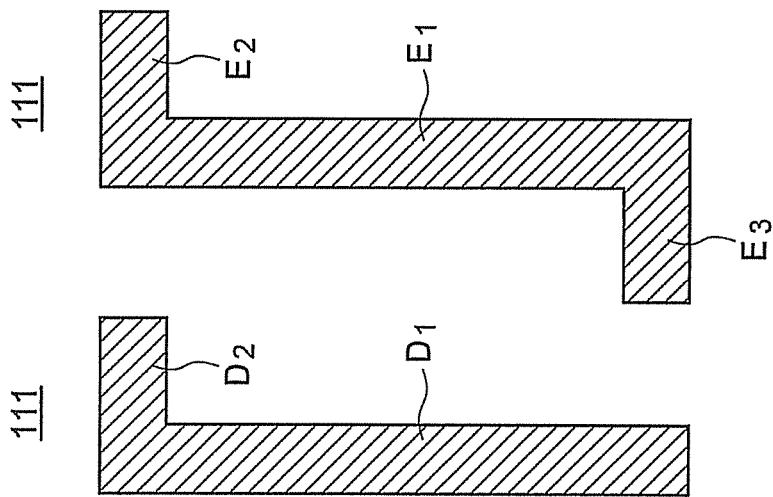
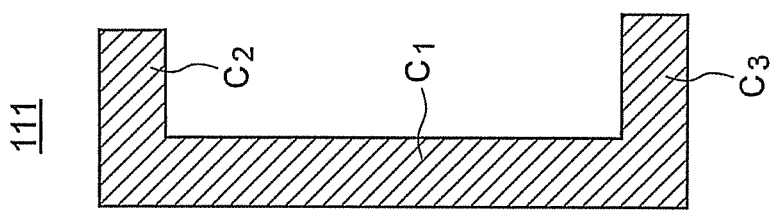
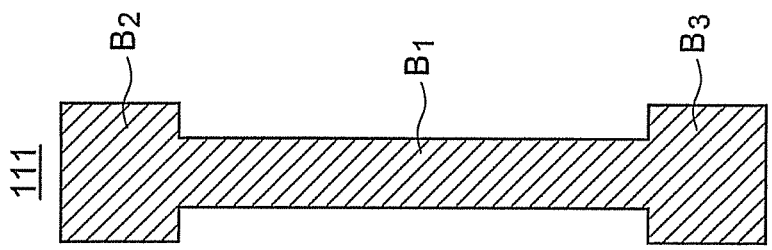
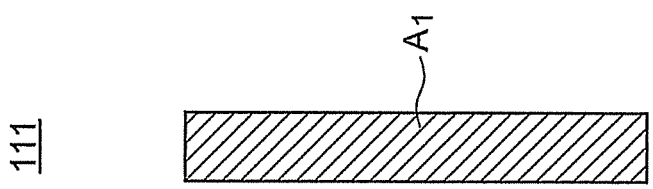
FIG.8A  FIG.8B  FIG.8C  FIG.8D  FIG.8E

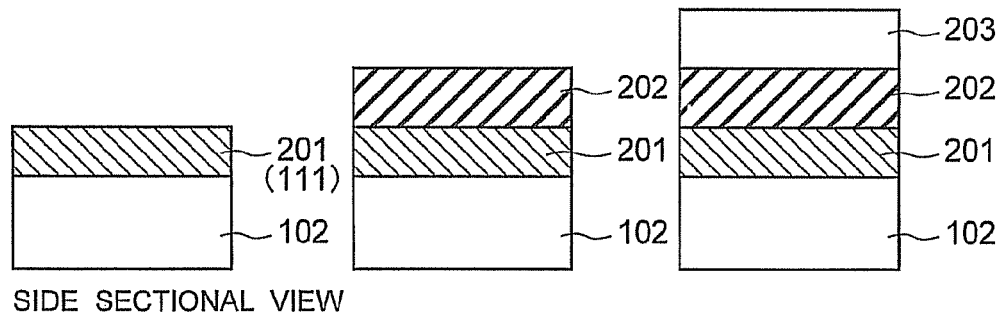
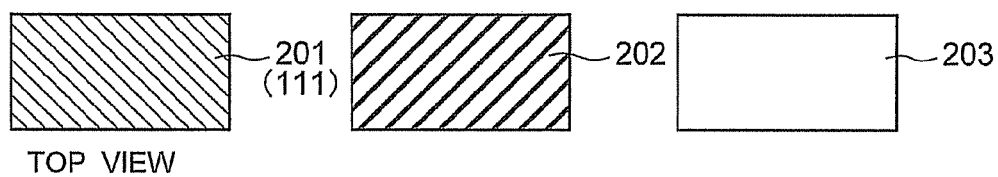
FIG.13A    FIG.13B    FIG.13C
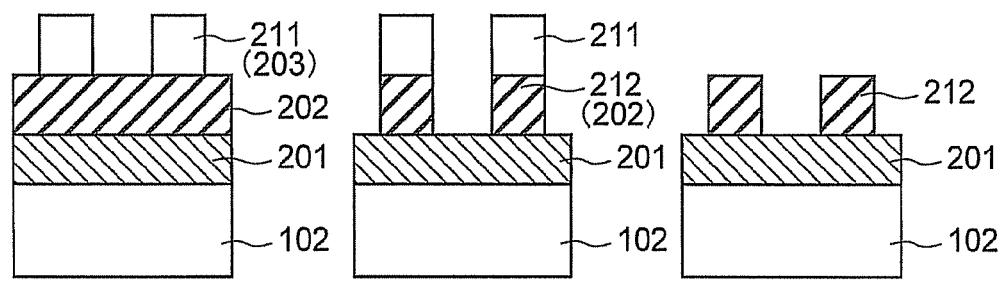
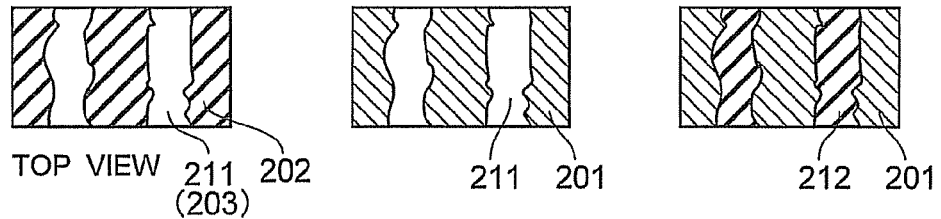
FIG.14A    FIG.14B    FIG.14C

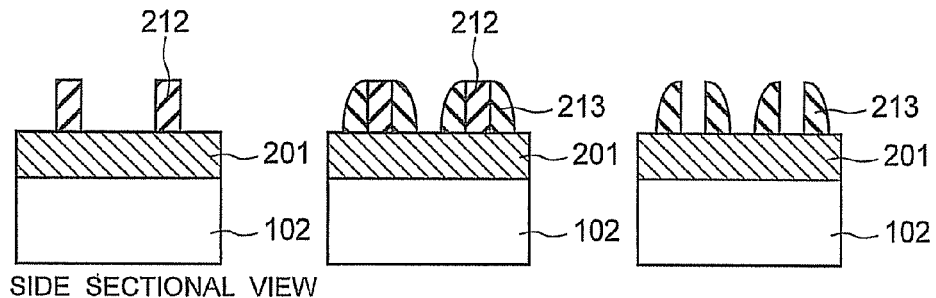
FIG.15A  FIG.15B  FIG.15C
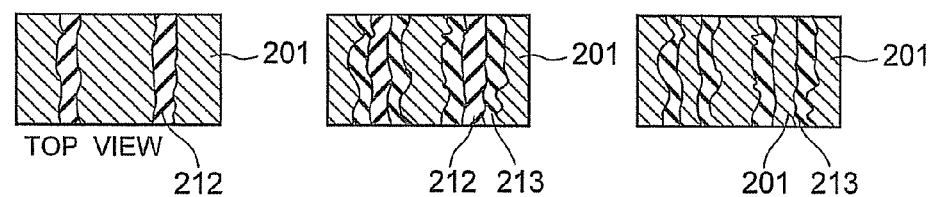
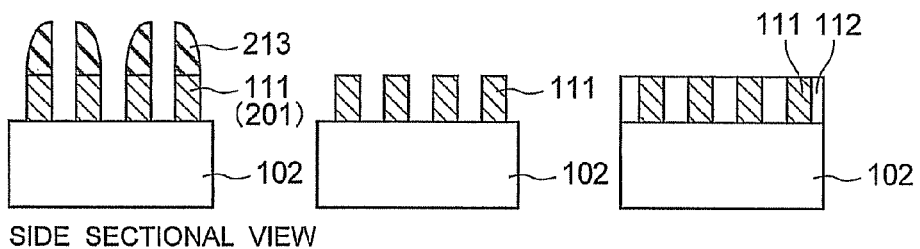
FIG.16A  FIG.16B  FIG.16C
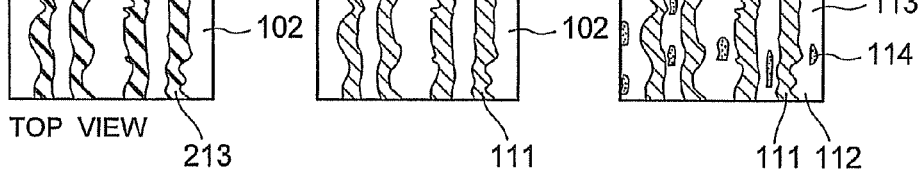

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2010-118386, filed on May 24, 2010, the entire contents of which are incorporated herein by reference.

FIELD

Embodiments described herein relate to a semiconductor device and a method of manufacturing the same.

BACKGROUND

Recently, the minimal dimension of metallic interconnects on semiconductor integrated circuits is becoming 30 nm or less due to strong demands for miniaturization. In such fine interconnects, the electrical resistivity of these interconnects becomes much higher than that of bulk crystal. This phenomenon is well known as the size effect on resistivity in metals. For example, resistivity of copper interconnects starts to increase when its minimal dimension becomes 100 nm or less.

BRIEF DESCRIPTION OF THE DRAWINGS

FIGS. 2A and 2B show plan views illustrating an ideal interconnect structure without the LER, and a realistic interconnect structure with the LER;

FIG. 3 is a graph showing simulation results of a size effect on a resistivity of the ideal interconnect without the LER and a resistivity of the realistic interconnect with the LER;

FIGS. 8A to 8E show plan views illustrating various examples of interconnects;

FIGS. 13A to 16C show side sectional views and top views illustrating a method of manufacturing a semiconductor device of a second embodiment.

DETAILED DESCRIPTION

Figure 1A:
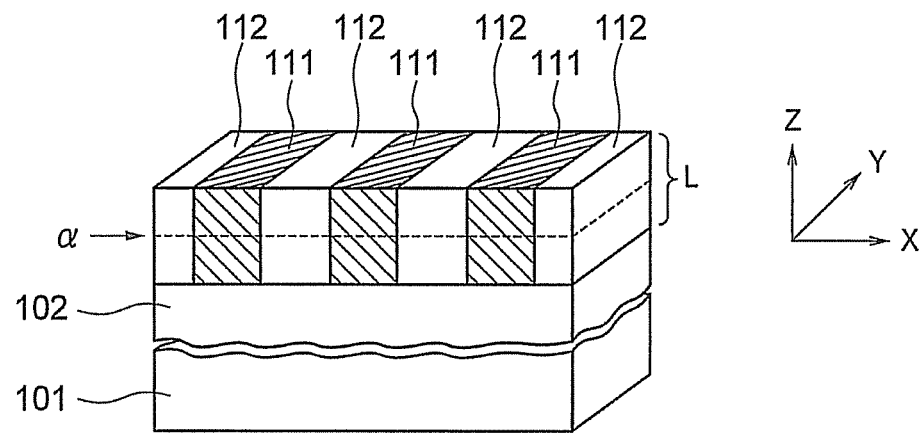
FIGS. 1A and 1B show a bird's-eye view and a sectional view illustrating a structure of a semiconductor device of a first embodiment.

Embodiments will now be explained with reference to the accompanying drawings.

One of origins of the size effect on resistivity is interface carrier (typically, that is electron in metals) scattering. If interconnect width and/or height are very narrow, carriers frequently impinge on an interface between an insulator part and a metal part, and carrier motion is frequently randomized. When a dimension of a metal interconnect becomes smaller than mean free path of carriers in bulk metal crystal, which is average distance carrier travels between collisions in metals, the mean free path is limited to the minimal dimension of the metal interconnect due to the interface scattering. Therefore, the mean free path of the carriers in the interconnects becomes smaller than that in a bulk metal crystal and resistivity of the metal interconnect increases.

On the other hand, in a process of manufacturing the semiconductor integrated circuit, LER (Line Edge Roughness) is generated on side surfaces of the interconnects. The LER is a shape fluctuation with a relatively large wavelength on the side surfaces of the interconnects, which is generated in the process of forming the interconnects. Although the mechanism of the generation of the LER is complicated and has not been sufficiently understood, the LER is considered to inevitably arise so long as the interconnect structure is patterned by lithography. A typical value of amplitude of the shape fluctuation due to the LER is 1 to 2 nm as represented by RMS (Root Mean Square) (A. Asenov et al., "Intrinsic Parameter Fluctuations in Decananometer MOSFETs Introduced by Gate Line Edge Roughness" ED-50, 5, pp. 1254-1260, 2003).

Also, it has been understood that the LER causes additional increase in resistivity in a fine interconnect. A Monte Carlo simulation (T. Kurusu et al., "Compact and efficient Monte Carlo method to reproduce size effect on resistivity in sub-0.1 um metallic interconnects," Proc. of 2009 International Conference on Simulation of Semiconductor Processes and Devices, pp. 170-173, 2009) and analytical method by another group (G. Lopez et al., "A new physical model and experimental measurements of copper interconnect resistivity considering size effects and line-edge roughness (LER)," Proc. of 2009 International Interconnect technology conference, pp. 231-233) show that the interconnect with the LER has a higher resistivity than an ideal interconnect without the LER and this phenomenon is stronger especially in a fine range.

Further, if the LER exists on both side surfaces of the interconnect, LWR (Line Width Roughness) which is a local increase or decrease in width between the side surfaces of the interconnect might be generated to cause a bottle neck in the interconnect. In such an interconnect, a flow of the carriers is limited in the bottle neck portion, which results in the increase in resistivity of the entire interconnect.

As described above, if the semiconductor integrated circuit is more miniaturized, the LER/LWR could enhance the size effect on resistivity in metallic interconnects. Degradation of electrical resistivity in interconnects due to the LER/LWR could bring significant increase in interconnect resistance. It is therefore desirable to provide a technique capable of suppressing such an increase of the interconnect resistance.

An embodiment described herein is, for example, a semiconductor device including a substrate, and a plurality of interconnects extending in a direction, having line shapes in plan view, and provided in the same interconnect layer above the substrate. The device further includes a plurality of insulators having line shapes in plan view and provided so as to be buried between the plurality of interconnects. Moreover, the plurality of interconnects include an interconnect group in which $2^N$ or more interconnects are successively arrayed so that correlation coefficients of line edge roughness (LER)

between both side surfaces of the respective interconnects are positive, where N is an integer of 4 or more.

Another embodiment described herein is, for example, a method of manufacturing a semiconductor device, the method including forming an interconnect material, a mask material, and a resist film successively above a substrate, and patterning the resist film into a plurality of resist patterns. The method further includes patterning the hard mask material into a plurality of mask patterns by using the resist patterns as a mask, and slimming the mask patterns. The method further includes forming sidewall films on side surfaces of the slimmed mask patterns, and removing the mask patterns after forming the sidewall films. The method further includes patterning the interconnect material into a plurality of interconnects by using the sidewall films as a mask after removing the mask patterns, and forming a plurality of insulators so as to be buried between the plurality of interconnects. Moreover, the plurality of interconnects include an interconnect group in which $2^N$ or more interconnects are successively arrayed so that correlation coefficients of line edge roughness (LER) between both side surfaces of the respective interconnects are positive, where N is an integer of 4 or more.

First Embodiment

Figure 1B:
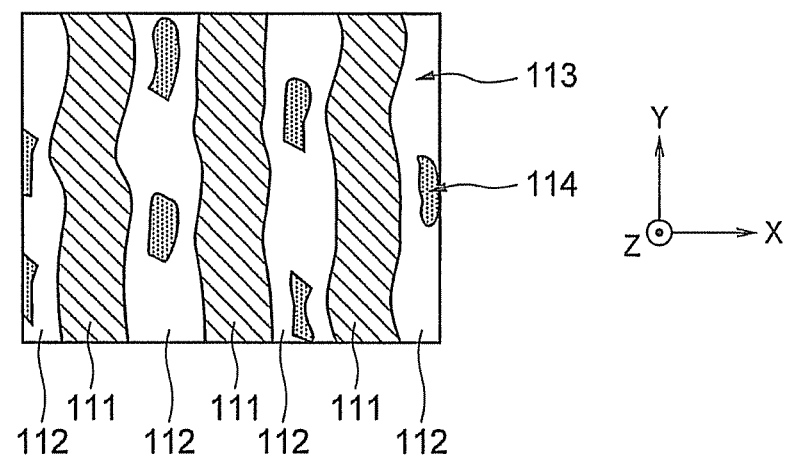

FIGS. 1A and 1B show a bird's-eye view and a sectional view illustrating a structure of a semiconductor device of a first embodiment. FIG. 1A is the bird's-eye view of the semiconductor device, and FIG. 1B is the sectional view along a cross section a shown in FIG. 1A.

FIG. 1A shows a substrate 101 and an inter layer dielectric 102. The substrate 101 is, for example, a silicon substrate. The inter layer dielectric 102 is, for example, a silicon oxide film. The inter layer dielectric 102 may be formed directly on the substrate 101, or may be formed on the substrate 101 via another layer. FIG. 1A shows a direction X and a direction Y which are parallel to a principal plane of the substrate 101 and are perpendicular to each other. FIG. 1A further shows a direction Z which is perpendicular to the principal plane of the substrate 101.

FIG. 1A further shows a plurality of interconnects 111 formed in the same interconnect layer L, and a plurality of insulators 112 formed so as to be buried between these interconnects 111. The interconnects 111 and the insulators 112 extend in the direction Y, and are alternately arranged along the direction X. Each of the interconnects 111 and the insulators 112 has a line shape in plan view. FIG. 1A shows an interconnect structure including the interconnects 111 and the insulators 112 formed on the inter layer dielectric 102.

The interconnects 111 may be metal interconnects, or may be formed of a material other than metal. Examples of the metal interconnects include copper interconnects and aluminum interconnects. Further, the insulators 112 may be portions of a lower inter layer dielectric (102), or may be portions of an upper inter layer dielectric.

FIG. 1B is the sectional view obtained by cutting the interconnect structure including the interconnects 111 and the insulators 112 along the cross section α perpendicular to the direction Z. FIG. 1B shows LER (Line Edge Roughness) generated on both side surfaces of the respective interconnects 111. FIG. 1B further shows first regions 113 and second regions 114 in the insulators 112.

1) LER of Interconnects 111

Hereinafter, the LER of the interconnects 111 is described in detail.

FIGS. 2A and 2B show plan views illustrating an ideal interconnect structure without the LER (FIG. 2A), and a realistic interconnect structure with the LER (FIG. 2B).

In a process of manufacturing the semiconductor device, the LER is generated on the side surfaces of the interconnects 111. The LER is a shape fluctuation with a relatively large wavelength on the side surfaces of the interconnects, which is generated in the process of forming the interconnects. As shown in FIG. 2B, the shape fluctuation exists on the side surfaces of the actual interconnects 111. Although the mechanism of the generation of the LER is complicated and has not been sufficiently understood, the LER is considered to inevitably occur so long as the interconnect structure is patterned by lithography.

FIG. 3 is a graph showing simulation results of a size effect on a resistivity of the ideal interconnect 111 without the LER and a resistivity of the realistic interconnect 111 with the LER.

As described above, in the fine interconnects 111, carrier scattering on interfaces between the interconnects 111 and the insulators 112 becomes dominant, so that the size effect on the resistivity becomes obvious. According to the size effect, the resistivity of such fine interconnects 111 becomes higher than that of interconnects having a larger width.

Further, as described in the BACKGROUND of the present specification, it has been understood that the LER also causes the increase in resistivity in such fine interconnects 111. FIG. 3 shows a result of a Monte Carlo simulation that the interconnect 111 with the LER has a higher resistivity than that of the interconnect 111 without the LER and this phenomenon is obvious especially in a fine range.

Figure 4:
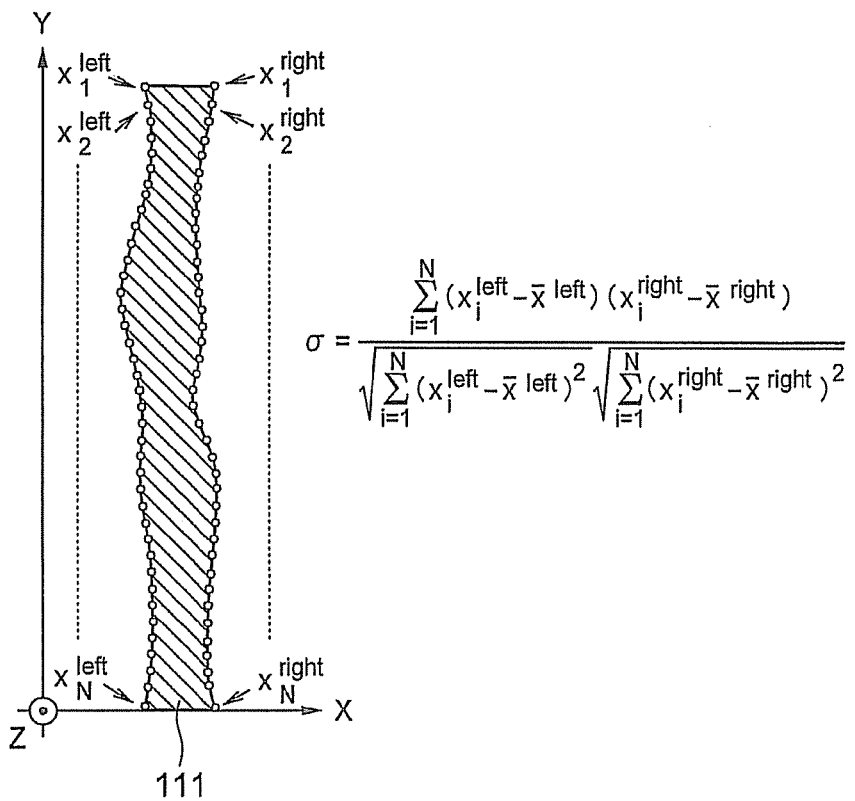
FIG. 4 is a diagram for explaining a definition of a correlation coefficient of the LER between both side surfaces of an interconnect.

FIG. 4 is a diagram for explaining a definition of a correlation coefficient σ of the LER between both side surfaces of an interconnect 111.

If the LER exists on the both side surfaces of the interconnect 111, LWR (Line Width Roughness) which is a local increase or decrease in width between the side surfaces of the interconnect 111 might be generated to cause a bottle neck in the interconnect 111. FIG. 4 shows the LWR generated in the width between the side surfaces of the interconnect 111. In such an interconnect 111, a flow of the carries is limited in the bottle neck portion, which results in the increase in resistivity of the entire interconnect 111.

The magnitude of the LWR generated due to the LER depends on correlation of the LER between both side surfaces of each interconnect 111. FIG. 4 shows a method of calculating the correlation coefficient σ of the LER between both side surfaces of the interconnect 111. In calculation of the correlation coefficient σ, as shown in FIG. 4, coordinates $x_i^{right}$ and $x_i^{left}$ on both side surfaces of the interconnect 111 are sampled at appropriate spacings between both ends of the interconnect 111. Next, the correlation coefficient σ is calculated using a definitional formula shown in FIG. 4. It is to be noted that $\bar{x}^{right}$ and $\bar{x}^{left}$ represent averages of $x_i^{right}$ and $x_i^{left}$, respectively, and N represents the number of sampling per one side surface.

The correlation coefficient σ can take a value from −1 to +1 from the definition. When the correlation coefficient σ is larger than 0, it is referred to that the LER of both side surfaces of the interconnect 111 has a positive correlation. When the correlation coefficient σ is smaller than 0, it is referred to that the LER of both side surfaces of the interconnect 111 has a negative correlation. When the correlation coefficient σ is 0, it is referred to that the LER of both side surfaces of interconnect 111 has no correlation.

Figure 5A:
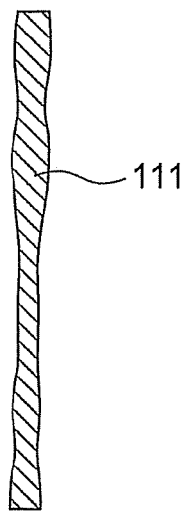
FIGS. 5A to 5C show plan views for explaining the relation between the correlation coefficient and the interconnect shape.
Figure 5B:
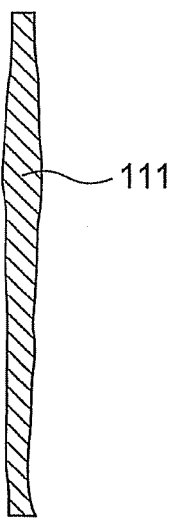
Figure 5C:
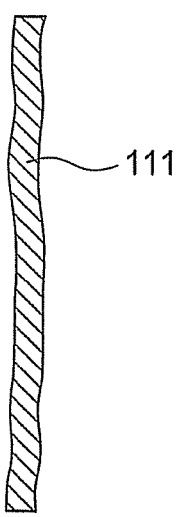

FIGS. 5A to 5C show plan views for explaining the relation between the correlation coefficient σ and the interconnect shape.

FIGS. 5A, 5B and 5C represent examples of interconnect shapes in the cases where the correlation coefficient σ is −1, 0 and +1, respectively. In the case of σ=−1, the LWR becomes maximal, and an extreme bottle neck is generated. On the other hand, in the case of σ=+1, phases and amplitudes of the LER of both side surfaces have the same values. This causes no LWR, and the interconnect width of the interconnect 111 in any region is equal to an average interconnect width. In the case of σ=0, the shape comes into an intermediate state between these cases.

Similarly, in the case of −1<σ<+1, the shape comes into an intermediate state between the case of σ=−1 and the case of σ=+1. However, in the case of −1<σ<0, the shape comes into a state with the emphasized LWR compared with the case of no correlation (σ=0). On the other hand, in the case of 0<σ<+1, the shape comes into a state with the suppressed LWR compared with the case of no correlation (σ=0). Accordingly, from the viewpoint of decreasing the LWR of the interconnect 111 to suppress an increase in resistivity, it is advantageous to make the LER of both side surfaces of the interconnect 111 have a positive correlation.

Figure 6:
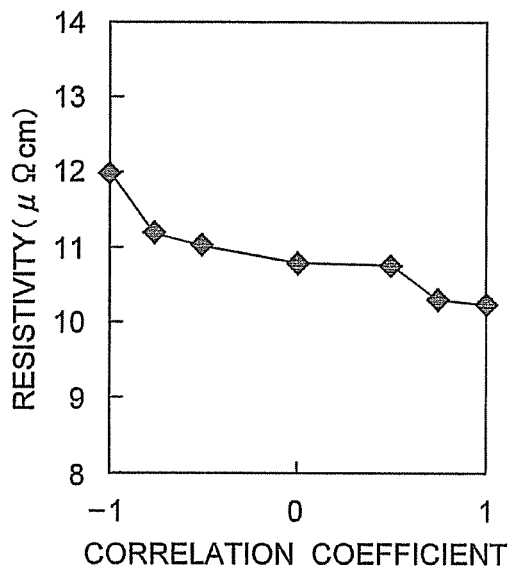
FIG. 6 is a graph showing simulation results of the relation between the correlation coefficient and the resistivity.

FIG. 6 is a graph showing simulation results of the relation between the correlation coefficient σ and the resistivity.

Similarly to FIG. 3, FIG. 6 shows the resistivity of the interconnect 111 obtained by the simulation. It is understood from FIG. 6 that in a region with a negative correlation, the resistivity is higher than that in the case of no correlation. Further, in a region with a positive correlation, the resistivity is lower than that in the case of no correlation. This result verifies the foregoing description that giving the LER a positive correlation is advantageous in suppressing an increase in resistivity of the interconnect 111.

Therefore, in this embodiment, the interconnect structure shown in FIG. 1 is formed so as to make the LER of both side surfaces of each interconnect 111 have a positive correlation coefficient. Consequently, in this embodiment, despite the existence of the LER of the interconnect 111, the LWR of the interconnect 111 reduces compared with the case of the LER having no correlation, which suppress the generation of the bottle neck of the interconnect 111. In this manner, it is possible to suppress an increase in resistivity of the interconnect 111 in this embodiment.

Although the LER of all interconnects 111 in the interconnect structure shown in FIG. 1 are desirably made to have positive correlation coefficients in this embodiment, part of the interconnects 111 in the interconnect structure may have negative correlation coefficients. In this embodiment, one or more interconnects 111 as many as possible are desirably made to have positive correlation coefficients. An example of methods of making the LER of the interconnects 111 have positive correlation coefficients is described in the following second embodiment.

Further, the LER of each interconnect 111 is desirably made to have as large a correlation coefficient as possible. For example, the correlation coefficient is desirably 0.7 or more. It has been found according to a result of a study conducted by the inventors that the correlation coefficient can be made about 0.7 to 0.8 by a method described in the following second embodiment.

2) LWR of Insulators 112

Next, the LWR of the insulators 112 is described in detail.

Figure 7:
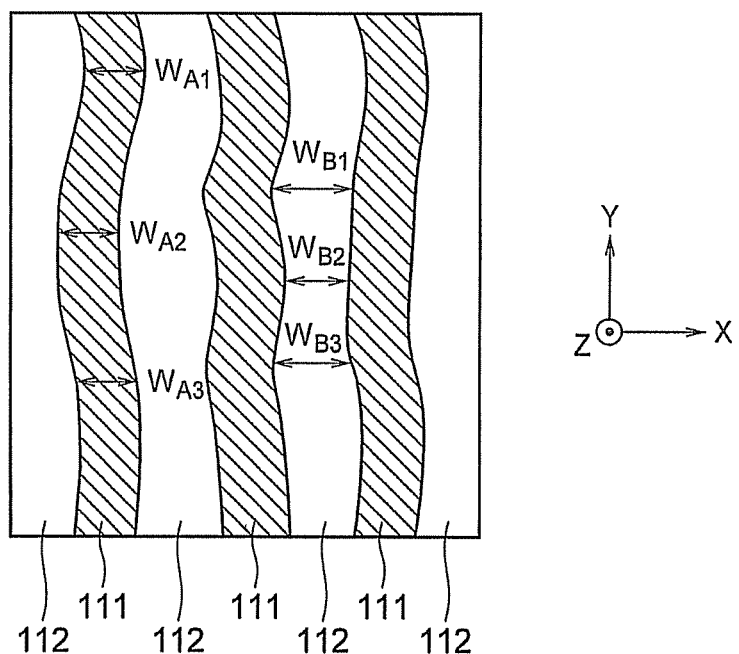
FIG. 7 is a plan view showing an interconnect structure including interconnects having positive correlation coefficients.

FIG. 7 is a plan view showing an interconnect structure including the interconnects 111 having positive correlation coefficients.

In the following second embodiment, the interconnects 111 are formed by etching by using sidewall films as a mask. In this method, the LER of both side surfaces of the interconnects 111 can be caused to have positive correlations, but the LWR is generated in widths between the side surfaces of the insulators 112.

FIG. 7 shows the interconnect structure including the interconnects 111 having positive correlation coefficients and the insulators 112 in which the LWR is generated. In FIG. 7, widths at three places in one interconnect 111 in the direction X are indicated by $W_{A1}$, $W_{A2}$ and $W_{A3}$, and widths at three places in one insulator 112 in the direction X are indicated by $W_{B1}$, $W_{B2}$ and $W_{B3}$. It is understood that this interconnect 111 has almost equal widths at the three places, whereas this insulator 112 has a large width at $W_{B1}$ and a small width at $W_{B2}$.

The LWR of an insulator 112 locally fluctuates a capacity between interconnects. Especially, a portion with a width narrowed due to the LWR in the insulator 112 contributes to an increase in capacity between the interconnects, and is therefore disadvantageous from the viewpoint of reducing the capacity between the interconnects.

As for the performance of the interconnects 111, an RC delay is one of indicators of the performance. To suppress the RC delay, it is required to decrease a value of RC which is a product of an interconnect resistance R and a capacitance C between interconnects. For this purpose, decreasing both the values of R and C is effective.

As described above, it is possible to decrease the interconnect resistance R by making the LER of both side surfaces of the interconnects 111 have positive correlations.

On the other hand, it is possible to decrease the capacitance C between interconnects by the insulator 112 formed of a material with a low permittivity. Recently, according to a technique referred to as an air gap, the capacitance between interconnects can be reduced by replacing the insulator with a cavity. Also, attention has been focused on a technique that the insulator is formed of a porous insulating material such as porous silicon dioxide, thereby reducing the capacitance between interconnects. Since permittivities of the cavity and the porous insulating material are close to 1, it is possible to reduce the capacitance between interconnects to a maximal degree. However, the cavity and the porous insulating material have a problem that mechanical strength of the interconnect structure is reduced.

Therefore, in this embodiment, as shown in FIG. 1, a first region(s) 113 and a second region(s) 114 are provided in each insulator 112. The second region 114 is located in a portion with a width locally narrowed due to the LWR, and the first region 113 is the whole region in the insulator 112 except for the second region 114. Any number of second regions 114 may exist in each insulator 112.

Further, in this embodiment, a permittivity of the second region 114 is set lower than that of the first region 113. Although the portion with a width narrowed due to the LWR greatly contributes to an increase in capacitance between interconnects as described above, this portion is provided with the second region 114 having a lower permittivity than that of the first region 113 in this embodiment, which can decrease the capacitance between interconnects and reduce the RC delay in the interconnects 111. In this embodiment, since the second region 114 is provided only in the portion with a width narrowed due to the LWR, a permittivity of the portion with a width narrowed due to the LWR becomes lower than a permittivity of a portion with a width widened due to the LWR.

In this embodiment, the second region 114 may be a cavity, or may be formed of a porous material. In this case, not the whole of the insulator 112 but only the second region 114 as part of the insulator 112 becomes the cavity or the porous film. Therefore, it is possible to reduce the capacitance between interconnects while holding mechanical strength of the interconnect structure.

The second region 114 formed of the cavity has an advantage that it can significantly decrease the capacitance between interconnects as compared with the case of the porous film. On the other hand, the second region 114 formed of the porous film has an advantage that it makes the interconnect structure have high mechanical strength as compared with the case of the cavity. Moreover, the first and second regions 113 and 114 may be made of a silicon oxide film and a low-k insulating film respectively, for example.

Further, although all of the insulators 112 in FIG. 1 are desirably provided with the first and second regions 113 and 114 in this embodiment, part of the insulators 112 in FIG. 1 may not be provided with these regions. In this embodiment, it is desirable to provide the first and second regions 113 and 114 in one or more insulators 112 as many as possible. An example of methods of providing these regions in the insulators 112 is described in the following second embodiment.

As described above, in this embodiment, it is possible to make the LER of both side surfaces of the interconnects 111 have positive correlations, thereby decreasing the interconnect resistance R. Further, it is possible to provide the first and second regions 113 and 114 in the insulators 112 as described above, thereby decreasing the capacitance C between interconnects. Therefore, according to this embodiment, it is possible to decrease both values of R and C by combining them, thereby effectively reducing the RC delay in the interconnects 111.

3) Definition of Correlation Coefficient

Herein, various examples of the interconnects 111 and a more general definition of the correlation coefficient corresponding to these examples are described.

FIGS. 8A to 8E show plan views illustrating various examples of interconnects 111.

FIG. 8A shows the interconnect 111 formed of only a straight line portion A1. FIG. 8B shows the interconnect 111 formed of a straight line portion $B_1$, a pad portion $B_2$ connected to one end of the straight line portion $B_1$ and a pad portion $B_3$ connected to the other end of the straight line portion $B_1$.

The interconnects 111 shown in FIGS. 8A and 8B have no bent, whereas the interconnects 111 shown in FIGS. 8C to 8E have bents. FIG. 8C shows the interconnect 111 including three straight line portions $C_1$ to $C_3$, and FIGS. 8D and 8E show the interconnects 111 having different shapes from this.

This embodiment is applicable to any one of the interconnects 111 of FIGS. 8A to 8E. The definition of the correlation coefficient when applying this embodiment to these interconnects 111 is described with reference to FIG. 9.

Figure 9:
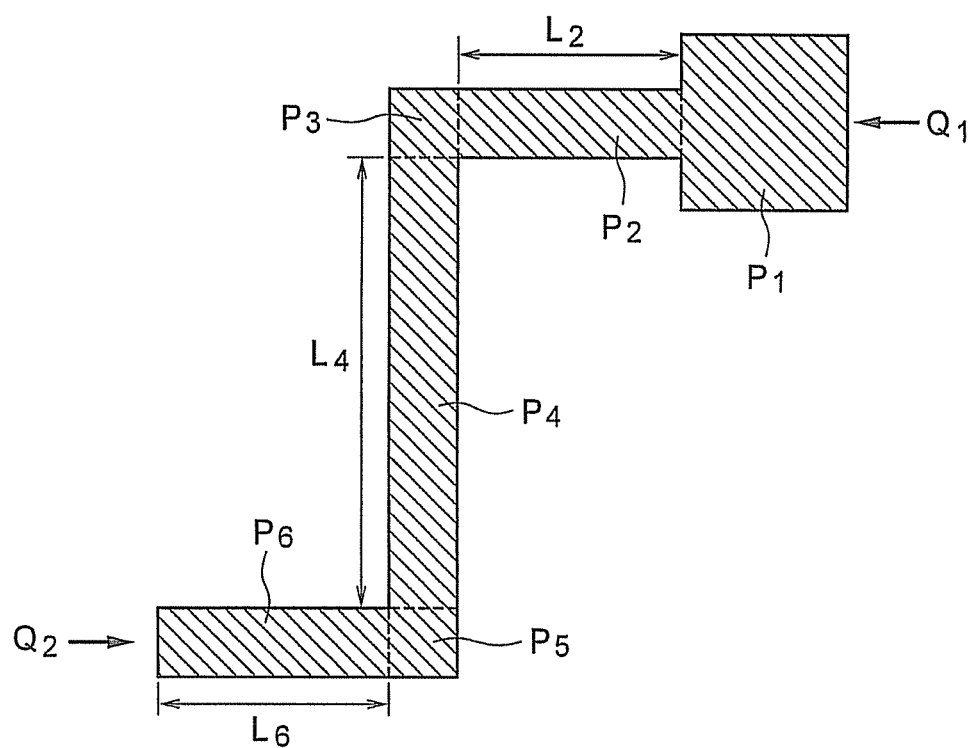
FIG. 9 is a plan view for explaining the definition of the correlation coefficient in a more general manner.

FIG. 9 is a plan view for explaining the definition of the correlation coefficient in a more general manner.

FIG. 9 shows the interconnect 111 including a pad portion $P_1$, corner portions $P_3$, $P_5$, and straight line portions $P_2$, $P_4$, $P_6$, and formed by mutually connecting these portions in the order of $P_1$ to $P_6$. FIG. 9 further shows one end of the interconnect 111 by $Q_1$, and the other end by $Q_2$.

In FIG. 9, the correlation coefficient is calculated regarding all of the straight line portions from the end $Q_1$ to the end $Q_2$ of the interconnect 111 except for the pad and corner portions of the interconnect 111. Specifically, the coordinates described in FIG. 4 are sampled on all of the straight line portions $P_2$, $P_4$, $P_6$ of the interconnect 111. The sampling coordinates of all of the straight line portions $P_2$, $P_4$, $P_6$ are then substituted into the definitional formula shown in FIG. 4, to calculate a correlation coefficient. This is the correlation coefficient of the LER of the interconnect 111 shown in FIG. 9.

In this embodiment, it is possible to reduce the interconnect resistance of the interconnect 111 shown in FIG. 9 by making this correlation coefficient positive.

4) Interconnect Group Having Positive Correlations

Next, an interconnect group including a plurality of interconnects 111 having positive correlations is described.

Figure 10:
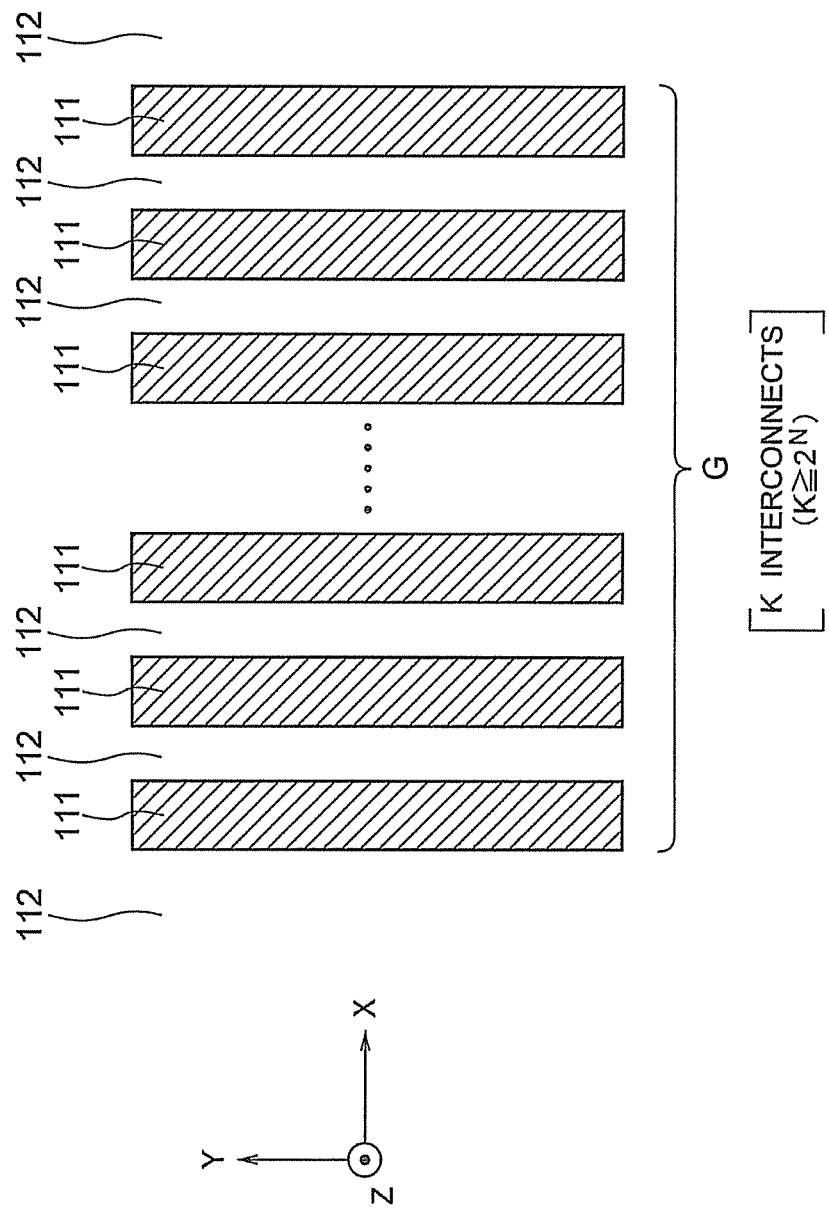
FIG. 10 is a plan view showing a plurality of interconnects formed in the same interconnect layer.

FIG. 10 is a plan view showing a plurality of interconnects 111 formed in the same interconnect layer.

FIG. 10 shows an interconnect group G including mutually adjacent K interconnects 111, where K is an integer of 2 or more. Similarly to FIG. 1, these interconnects 111 extend in the direction Y, and are mutually adjacent in the direction X. In FIG. 10, it is assumed that the K interconnects 111 all have positive correlation coefficients σ. In this manner, the K interconnects 111 in FIG. 10 are successively arrayed so as to have positive correlation coefficients σ.

In this embodiment, the interconnect structure is formed so as to include the interconnect group G in which $2^N$ or more interconnects 111 having positive correlation coefficients σ are successively arrayed (i.e., K≥$2^N$), where N is an integer of 4 or more, and more preferably 5 or more.

Hereinafter, a reason for forming such an interconnect structure is described.

In general, interconnects are often handled in units of power-of-2 interconnects in a semiconductor device. For example, bit lines and word lines of a flash memory or the like are often handled in units of 16 lines ($2^4$ lines) or 32 lines ($2^5$ lines). For example, in a NAND memory, 32 word lines are often connected to one NAND string, and power-of-2 bit lines are often provided between dummy active areas (AAs) in a NAND cell array.

In such a case, variations in physical property value among these interconnects are preferably made as small as possible, and for example, variations in correlation coefficient σ among these interconnects are also preferably made as small as possible. For example, when there are variations in physical property value among these interconnects, currents and voltages are conveyed in different manners in the interconnects, and it is thereby inconvenient in the case of using these interconnects for the same purpose. Therefore, the condition of σ>0 is desirably realized in units of power-of-2 interconnects, such as units of 16 interconnects or 32 interconnects. According to such interconnects, it is possible to suppress an increase in resistivity regarding all of the successive power-of-2 interconnects.

Accordingly, in this embodiment, the interconnect group G is formed so that $2^N$ or more interconnects 111 with σ>0 are successively arrayed. The interconnect group G formed in such a manner can be used as the foregoing bit lines and word lines, for example.

In general, interconnects of the semiconductor device are often handled by units of not less than $2^4$ (16) or $2^5$ (32) interconnects. Therefore, for applying the interconnect group G to interconnects such as the bit lines and the word lines, it is desirable that the number of interconnects in the interconnect group G be $2^4$ (16) or more, and more preferably be $2^5$ (32) or more. Therefore, in this embodiment, the value of N is made to be an integer of 4 or more, and more preferably an integer of 5 or more. Such an interconnect group G can be formed, for example, by the method of the following second embodiment.

Further, the number of interconnects in the interconnect group G may be a power of 2 (e.g. 32) or a number other than a power of 2 (e.g. 34). In the latter case, 32 interconnects 111 may be used as the word lines, and the remaining two interconnects may be used as selection lines, for example.

Moreover, in this embodiment, the interconnect structure may be formed to include the interconnect group G in which $2^N$ or more interconnects 111 having correlation coefficients σ of 0.7 or more are successively arrayed. According to such an interconnect group G, it is possible to further effectively suppress an increase in resistivity of these interconnects 111.

Furthermore, in this embodiment, plural sets of such interconnect groups G may be provided in the same interconnect layer. For example, these interconnect groups G can be applied to the case where interconnect groups G each including 32 interconnects 111 are formed and used as the interconnects 111 for plural NAND strings.

5) Periodic Interconnect Structure

Next, the LER of the interconnects 111 forming a periodic interconnect structure is described. The periodic interconnect structure shown below corresponds to a specific example of the foregoing interconnect group G when the number of interconnects 111 is $2^N$ or more.

Figure 11:
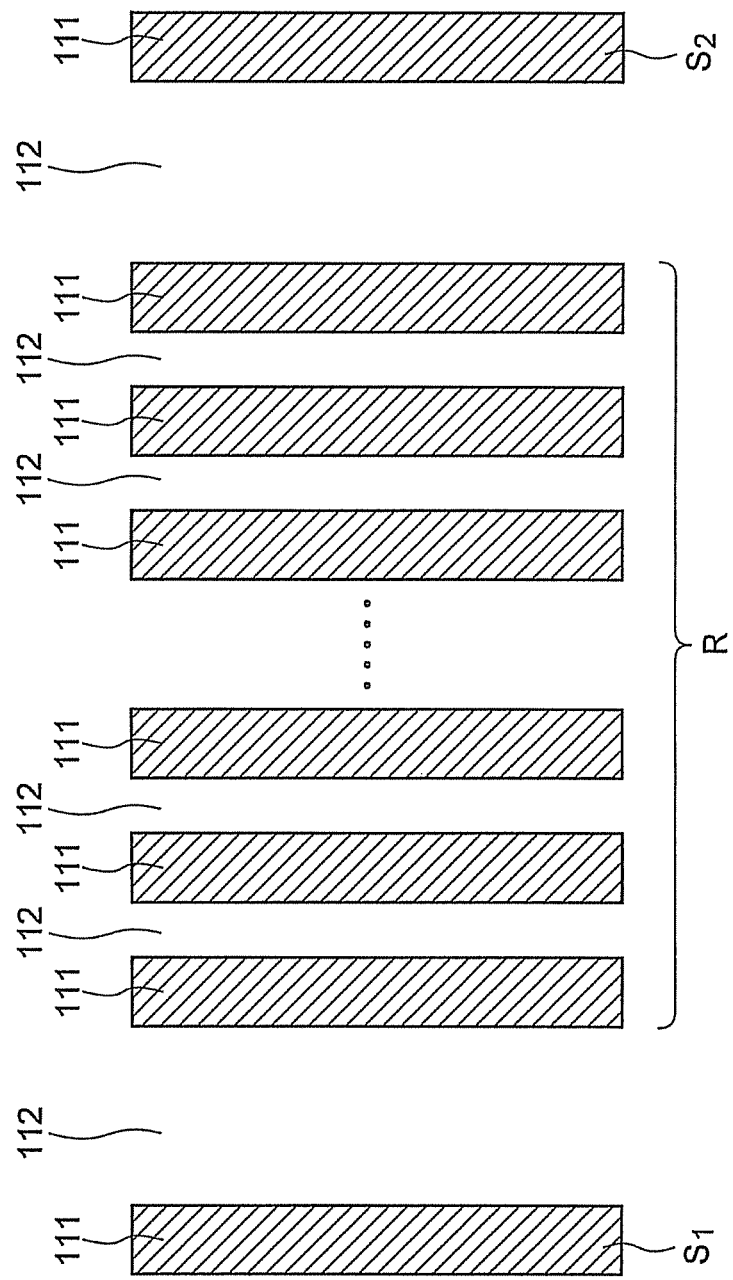
FIG. 11 is a plan view showing an example of a periodic interconnect structure.

FIG. 11 is a plan view showing an example of the periodic interconnect structure.

FIG. 11 shows a periodic region R in which the interconnects 111 and the insulators 112 are provided alternately and periodically. In the periodic region R, the interconnects 111 and the insulators 112 are alternately arranged in a fixed period. FIG. 11 further shows interconnects $S_1$ and $S_2$ arranged outside the periodic region R.

In such a periodic region R, variations in physical property value among the interconnects 111, and variations in physical value among the insulators 112 are desirably made as small as possible. Therefore, in the periodic region R, the correlation coefficients c of all of the interconnects 111 are desirably positive, and more desirably 0.7 or more.

Further, in the case of forming all of the interconnects 111 in the periodic region R by the same method and forming all of the insulators 112 in the periodic region R by the same method, it is expected that the LWR is often generated on all of the insulators 112 in the periodic region R. In this case, the first and second regions 113 and 114 described above are desirably provided in all of the insulators 112 (this also applies to the foregoing interconnect group G).

What are described above may be applied to all of the periodic regions on the substrate 101 of the semiconductor device of this embodiment, or may be applied to part of the periodic regions on the substrate 101.

Figure 12:
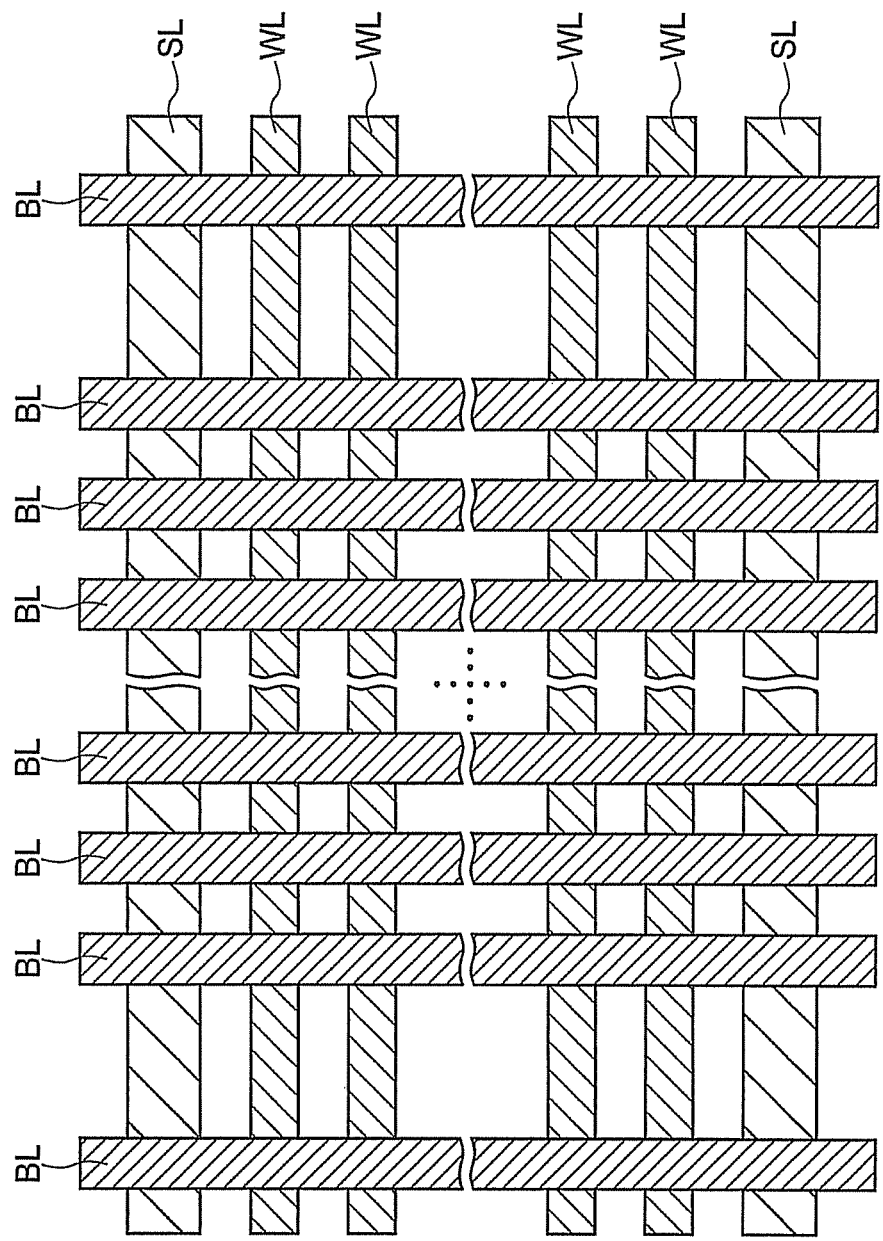
FIG. 12 is a plan view showing an example of an interconnect structure in a memory cell array of a NAND memory.

FIG. 12 shows a specific example of the periodic region R shown in FIG. 11. FIG. 12 is a plan view showing an example of an interconnect structure in a memory cell array of a NAND memory.

FIG. 12 shows a plurality of word lines WL and selection lines SL extending in a horizontal direction on paper, and a plurality of bit lines BL extending in a vertical direction on paper. FIG. 12 shows the periodic region R including the plurality of bit lines BL, and this periodic region R is sandwiched between non-periodic regions. These non-periodic regions are provided because AA regions forming the memory cell array include normal AA regions, and dummy AA regions having a larger width than that of the normal AA regions.

In FIG. 12, all of the bit lines BL in the periodic region R are preferably made to have positive correlation coefficients σ.

As described above, in this embodiment, the interconnect structure is formed so that the correlation coefficients of the LER between both side surfaces of the respective interconnects 111 are positive. This makes it possible to suppress an increase in resistivity of the interconnects 111 due to the LER and the LWR.

Further, in this embodiment, the insulator 112 in which the LWR is generated in a width between its side surfaces is provided with the first region 113, and the second region 114 located in a portion with a width locally narrowed due to the LWR. Also, a permittivity of the second region 114 is made lower than a permittivity of the first region 113. This makes it possible to decrease a capacitance between interconnects, while holding mechanical strength of the interconnect structure.

Moreover, in this embodiment, it is possible to decrease both the interconnect resistance R and the capacitance C between interconnects by combining the above interconnects 111 with the above insulator 112, which can effectively reduce the RC delay in the interconnects 111.

Furthermore, in this embodiment, the interconnect structure is formed to include the interconnect group G in which $2^N$ or more interconnects 111 having positive correlation coefficients are successively arrayed, where N is an integer of 4 or more. In general, interconnects are often handled in units of power-of-2 interconnects, such as units of 16 interconnects or 34 interconnects in the semiconductor device. According to this embodiment, by applying all or part of the interconnects 111 in the interconnect group G as a group of interconnects in such a semiconductor device, an increase in resistivity of all of the interconnects in the group can be suppressed. Further, this makes it possible to reduce variations in correlation coefficient of these interconnects. This has an advantage that variations in resistivity of these interconnects can be reduced, for example.

The size effect on the resistivity of the interconnects 111 is often problematic in a fine range where an average interconnect width of the interconnects 111 is 30 nm or less. Accordingly, this embodiment is effective when applied to the interconnects 111 having an average interconnect width of 30 nm or less, for example.

Further, it is considered that the insulators 112 often have a width nearly equal to the width of the interconnects 111. Therefore, it is effective to apply this embodiment to the insulators 112 having an average width of 30 nm or less.

In the following, a second embodiment is described. Since the second embodiment is a modification of the first embodiment, the second embodiment is described with focusing on differences from the first embodiment.

Second Embodiment

FIGS. 13A to 16C show side sectional views and top views illustrating a method of manufacturing a semiconductor device of a second embodiment.

The method of this embodiment is one example of methods capable of manufacturing the semiconductor device shown in FIG. 1. The interconnect structure shown in FIG. 1 can be formed by combining a sidewall transfer process as a kind of double patterning with a reactive ion etching (RIE) process.

First, as shown in FIG. 13A, an inter layer dielectric (ILD) 102 is formed on a substrate 101. Next, as shown in FIG. 13A, an interconnect material 201 for forming the interconnects 111 is deposited.

Next, as shown in FIG. 13B, a hard mask material (core material) 202 for forming a hard mask is deposited on the interconnect material 201. The hard mask material 202 is, for example, a silicon oxide film or a silicon nitride film. Then, as shown in FIG. 13C, a resist film 203 is formed on the hard mask material 202.

Next, as shown in FIG. 14A, the resist film 203 is patterned into a plurality of resist patterns 211 by lithography. Then, as shown in FIG. 14B, the hard mask material 202 is patterned into a plurality of mask patterns 212 by etching by using the resist patterns 211 as a mask. Then, as shown in FIG. 14C, the resist patterns 211 having been used for the etching are removed.

As described above, the mask patterns 212 are patterned by lithography. This results in generation of the LER of both side surfaces of the respective mask patterns 212 (FIG. 14C). Further, the LER of both side surfaces of the respective mask patterns 212 is random, so that the LWR is generated in the width between the side surfaces of the mask patterns 212 (FIG. 14C).

Next, as shown in FIG. 15A, the mask patterns 212 are slimmed so that a width of each mask pattern 212 is reduced into about half. The LER of both side surfaces of the mask patterns 212 after slimming is also random, so that the LER and the LWR of the mask patterns 212 remain after the slimming.

Next, as shown in FIG. 15B, sidewall films 213 are formed on both side surfaces of the respective slimmed mask patterns 212. The sidewall films 213 may be silicon oxide films or silicon nitride films for example, but is formed of a different material from that for the mask patterns 212.

As shown in FIG. 15B, the sidewall films 213 grow while holding information of the LER of the side surfaces of the mask patterns 212. Therefore, the phases and amplitudes of both side surfaces of each sidewall film 213 have the same values, so that the correlation coefficient σ of the LER between both side surfaces of each sidewall film 213 becomes positive.

Next, as shown in FIG. 15C, the mask patterns 212 are removed after forming the sidewall films 213. At this time, the sidewall films 213 remain on the interconnect material 201.

Next, as shown in FIG. 16A, after removing the mask patterns 212, the interconnect material 201 is patterned into a plurality of interconnects 111 by RIE by using the sidewall films 213 as a mask. Then, as shown in FIG. 16B, the sidewall films 213 having been used for the RIE are removed.

As shown in FIGS. 15B to 16B, the LER of both side surfaces of the sidewall films 213 are transferred to both side surfaces of the interconnects 111. Therefore, the phases and amplitudes of both side surfaces of each interconnect 111 have the same values, so that the correlation coefficient σ of the LER between both side surfaces of each interconnect 111 becomes positive.

Next, as shown in FIG. 16C, a plurality of insulators 112 is formed so as to be buried between the interconnects 111. The insulators 112 can be formed, for example, by depositing an inter layer dielectric on the entire surface of the substrate 101 and planarizing the inter layer dielectric by chemical mechanical polishing (CMP).

In this embodiment, as shown in FIG. 15B, while the correlation coefficient of the LER between the side surfaces of the same sidewall film 213 is positive, the correlation coefficient of the LER between the side surfaces of different sidewall films 213 is random, so that the latter correlation coefficient may be positive or negative (or may also be 0).

For this reason, as shown in FIG. 16C, the LER of both side surfaces of each insulator 112 becomes random. Consequently, the LWR is generated in the width between the side surfaces of each insulator 112, so that a portion with a large width and a portion with a small width are locally formed in each insulator 112.

Therefore, in this embodiment, a material and a process having poor burying properties with respect to the width (half pitch) between the interconnects 111 are adopted as a material and a formation process for the insulators 112. This makes it possible to form voids in a region with a locally narrowed width between the interconnects 111 (i.e., a region with a locally narrowed width in the insulators 112) in a self-aligned manner (FIG. 16C). On the other hand, in a region with a locally widened width between the interconnects 111, the insulators 112 without such voids are formed (FIG. 16C). Examples of the buried material for the insulators 112 include a silicon oxide film.

In FIG. 16C, the numeral 114 denotes regions (second regions) formed of the voids, and the numeral 113 denotes the other regions (first regions). By using the voids as they are, a structure including the second regions 114 formed of cavities is realized. On the other hand, by filling the voids with a porous material or a low-k material, a structure including the second regions 114 formed of porous films or low-k films is realized.

As described above, in this embodiment, the hard mask patterns 212 are formed via lithography, the sidewall films 213 are formed on both side surfaces of the respective hard mask patterns 212, and the interconnects 111 are formed by using the sidewall films 213 as a mask. This makes it possible to form the interconnect structure in which the correlation coefficients of the LER between both side surfaces of the respective interconnects 111 are positive. Consequently, it is possible to suppress an increase in resistivity of the respective interconnects 111 due to the LER and the LWR.

Further, in this embodiment, when the insulators 112 are buried between the interconnects 111, the material and the process having poor burying properties are adopted as the material and the formation process for the insulators 112. This makes it possible to provide the insulators 112 in which the LWR is generated in the width between the side surfaces, with the first region 113, and the second region 114 located in the portion with a locally narrowed width due to the LWR, and to make the permittivity of the second region 114 lower than the permittivity of the first region 113. Consequently, it is possible to decrease the capacitance between interconnects, while holding mechanical strength of the interconnect structure.

Further, in this embodiment, both of the interconnect resistance R and the capacitance C between interconnects can be reduced by combining the above method of forming the interconnects 111 and the above method of forming the insulator 112. As a result, the RC delay in the interconnects 111 can be effectively reduced.

Moreover, in this embodiment, a plurality of interconnects 111 are formed by using the plurality of sidewall films 213 formed in the above described manner. This makes it possible to form the interconnect structure in which the interconnects 111 are successively arrayed so as to have positive correlation coefficients. For example, as described in the first embodiment, it is possible to form the interconnect structure including the interconnect group G in which $2^N$ or more interconnects 111 having positive correlation coefficients are successively arrayed, where N is an integer of 4 or more. The inventors formed 50 samples of patterns with a length of about 400 nm corresponding to the interconnects 111 by the method of this embodiment, sampled edge information on both side surfaces of these patterns from a TEM image, and calculated correlation coefficients of these patterns by using the sampling results. According to the result of this study by the inventors, all of the patterns had positive correlation coefficients and an average of these correlation coefficients was 0.72.

The semiconductor of FIG. 1 may be manufactured by a method other than the method of this embodiment.

Further, although all of the interconnects 111 formed by the method of this embodiment are desirably have positive correlation coefficients, part of these interconnects 111 may have negative correlation coefficients. In the method of this embodiment, it is desirable to make one or more interconnects 111 as many as possible have positive correlation coefficients.

Moreover, although all of the insulators 112 formed by the method of this embodiment are desirably provided with the first and second regions 113 and 114, part of these insulators 112 may not be provided with these regions. In the method of this embodiment, it is desirable to provide the first and second regions 113 and 114 in one or more insulators 112 as many as possible among the insulators 112 where the LWR is generated.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising: a substrate;
a plurality of interconnects extending in a direction, having line shapes in plan view, and provided in the same interconnect layer above the substrate; and
a plurality of insulators having line shapes in plan view and provided so as to be buried between the plurality of interconnects,
wherein the plurality of interconnects include an interconnect group in which $2^N$ or more interconnects are successively arrayed so that correlation coefficients of line edge roughness (LER) between both side surfaces of the respective interconnects are positive, where N is an integer of 4 or more; and
wherein widths of the plurality of insulators have line width roughness (LWR), and at least one of the plurality of insulators includes:
a first region having a first permittivity; and
a second region having a second permittivity which is lower than the first permittivity, and located in a portion having a width locally narrowed due to the LWR, the at least one of the plurality of insulators including the first and second regions in the same cross section parallel to a principal surface of the substrate.

2. The device of claim 1, wherein the second region is a cavity.

3. The device of claim 1, wherein the second region is formed of a porous material or a low-k insulating material.

4. The device of claim 1, wherein an average width of each of the plurality of interconnects is 30 nm or less.

5. The device of claim 1, wherein an average width of each of the plurality of insulators is 30 nm or less.

6. The device of claim 1, wherein
the $2^N$ or more interconnects are successively arrayed so that the correlation coefficients of the respective interconnects are 0.7 or more.

7. The device of claim 1, wherein
the plurality of interconnects include an interconnect group in which $2^M$ or more interconnects are successively arrayed so that the correlation coefficients of the respective interconnects are positive, where M is an integer of 5 or more.

8. The device of claim 1, further comprising a periodical region in which the plurality of interconnects and the plurality of insulators are provided alternately and periodically above the substrate,
wherein
the plurality of interconnects in the periodical region form the interconnect group, and
the correlation coefficients of all of the plurality of interconnects in the periodical region are positive.

9. The device of claim 8, wherein
the correlation coefficients of all of the plurality of interconnects in the periodical region are 0.7 or more.

* * * * *